US008143119B2

(12) United States Patent
Sakoh et al.

(10) Patent No.: US 8,143,119 B2
(45) Date of Patent: Mar. 27, 2012

(54) METHOD OF MANUFACTURING SEMICONDUCTOR DEVICE HAVING PLURAL TRANSISTORS FORMED IN WELL REGION AND SEMICONDUCTOR DEVICE

(75) Inventors: Takashi Sakoh, Kanagawa (JP); Hiroki Shirai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 277 days.

(21) Appl. No.: 12/585,379

(22) Filed: Sep. 14, 2009

(65) Prior Publication Data
US 2010/0078734 A1    Apr. 1, 2010

(30) Foreign Application Priority Data
Sep. 26, 2008  (JP) .................................. 2008-248973

(51) Int. Cl.
*H01L 21/336* (2006.01)
(52) U.S. Cl. ........ 438/197; 438/199; 438/229; 438/275; 257/392
(58) Field of Classification Search .................. 438/197, 438/199, 229, 275; 257/392, E27.06, E21.616
See application file for complete search history.

(56) References Cited

U.S. PATENT DOCUMENTS 5,981,326 A * 11/1999 Wanlass ......................... 438/227
7,432,597 B2 * 10/2008 Kitamura et al. ............. 257/758

FOREIGN PATENT DOCUMENTS

JP          10-11975          1/1998
* cited by examiner

*Primary Examiner* — Theresa T Doan
(74) *Attorney, Agent, or Firm* — McGinn IP Law Group, PLLC

(57) ABSTRACT

A first transistor and a second transistor are formed in a first element formation region, and a third transistor is formed in a second element formation region. The three transistors are of the same conductive type, and the first transistor and the second transistor have the same threshold voltage. A first well is formed in the first element formation region by use of a first mask pattern, and a second well is formed in the second element formation region by use of a second mask pattern. A channel region of the first transistor and a channel region of the second transistor have a shape which is line-symmetrical with respect to a reference line. The first mask pattern has a shape which is line-symmetrical with respect to the reference line.

9 Claims, 15 Drawing Sheets

US 8,143,119 B2

METHOD OF MANUFACTURING SEMICONDUCTOR DEVICE HAVING PLURAL TRANSISTORS FORMED IN WELL REGION AND SEMICONDUCTOR DEVICE

INCORPORATION BY REFERENCE

This application is based upon and claims the benefit of priority from Japanese Patent Application No. 2008-248973 which was filed on Sep. 26, 2008, the disclosure of which is incorporated herein in its entirety by reference.

BACKGROUND OF THE INVENTION

1. Field of the Invention

The present invention relates to a method of manufacturing a semiconductor device, and more particularly to a semiconductor device having two transistors whose threshold voltages are equal to each other and to a semiconductor device.

2. Description of Related Art

In forming an amplification circuit by using transistors, it is necessary to use two transistors whose threshold voltages are equal to each other. For example, Patent Document (Japanese Patent Application Laid-Open No. 10-11975) describes a sense amplifier circuit in a semiconductor storage circuit. A flip-flop circuit is used as the sense amplifier circuit, and in the flip-flop circuit, two transistors whose threshold voltages are equal to each other are used.

SUMMARY

In forming a transistor, first, it is necessary to form a well. When a plurality of transistors adjacent to each other are of the same conductive type, usually, a well of these plurality of transistors is formed by using one mask. Because in recent years it has been necessary to increase the integration ratio of semiconductor devices, the well of the plurality of transistors is formed as one common well.

The plurality of transistors of the same conductive type may sometimes include two transistors whose threshold voltages are required to be equal to each other. In a case where either of these two transistors is positioned at an end of the common well, threshold voltages of these two transistors were sometimes different from each other even when the two transistors were formed in the same step.

As a result of an investigation by the present inventors, it became evident that as shown in FIG. 15, when impurity ions are introduced into a substrate 710 by use of a mask pattern 750, the impurity ions collide against a side wall of an opening 752 of the mask pattern 750 and rebound therefrom, whereby in part of a subsurface of the well, a high-concentration region 714 having a higher ion concentration than in other portions of the well is formed. When the high-concentration region 714 overlaps a channel region of a transistor, the threshold voltage of the transistor changes. The present inventors found out that if the high-concentration region 714 is formed in only either of the two transistors, then the threshold voltages of the two transistors become different from each other.

According to an exemplary aspect, a semiconductor device includes:
a first transistor of a first conductive type and a second transistor of the first conductive type whose threshold voltages are equal to each other, in a first element formation region, and a third transistor of the first conductive type, in a second element formation region positioned adjacent to the first element formation region.

The second transistor is positioned between the first transistor and the third transistor, and a channel region of the first transistor and a channel region of the second transistor has a shape which is line-symmetrical with respect to a reference line extending between the channel regions of the first and second transistors.

A method of forming a semiconductor device includes:
isolating the first element formation region and the second element formation region from each other by forming an element isolating film on a substrate,
forming, on the substrate, a first mask pattern which has a first opening exposing the first element formation region and having a shape which is line-symmetrical with respect to the reference line, and covers the second element formation region,
forming a first well of a second conductive type in the first element formation region by ion-implanting an impurity of the second conductive type into the substrate by using the first mask pattern as a mask,
removing the first mask pattern,
forming, on the substrate, a second mask pattern which has a second opening exposing the second element formation region and covers the first element formation region,
forming a second well of the second conductive type in the second element formation region by ion-implanting an impurity of the second conductive type into the substrate by using the second mask pattern as a mask,
removing the second mask pattern, and
forming the first transistor and the second transistor in the first element formation region, and the third transistor in the second element formation region.

When impurity ions are introduced into a substrate by use of a mask pattern, the impurity ions collide against a side wall of an opening of the mask pattern and rebound therefrom, whereby in part of a subsurface of the well, a high-concentration region having a higher ion concentration than in other portions of the well may sometimes be formed. When the high-concentration region overlaps a channel region of a transistor, the threshold voltage of the transistor may sometimes change. In the exemplary aspect, the channel region of the first transistor and the channel region of the second transistor are line-symmetrical with respect to a reference line, and also the first opening of the first master pattern is line-symmetrical with respect to the reference line. For this reason, even when the high-concentration region formed with the first well overlaps the channel region of the first transistor, the high-concentration region similarly overlaps also the channel region of the second transistor. Therefore, it is possible to prevent the threshold voltage of the first transistor and the threshold value of the second transistor from being different from each other.

The first well and the second well may be linked together at a linking portion where the concentration of an impurity of the second conductive type is higher than in other portions of the first well and the second well.

According to the exemplary aspects, it is possible to prevent threshold voltages from obtaining different values in two transistors which are required to have threshold voltages equal to each other.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
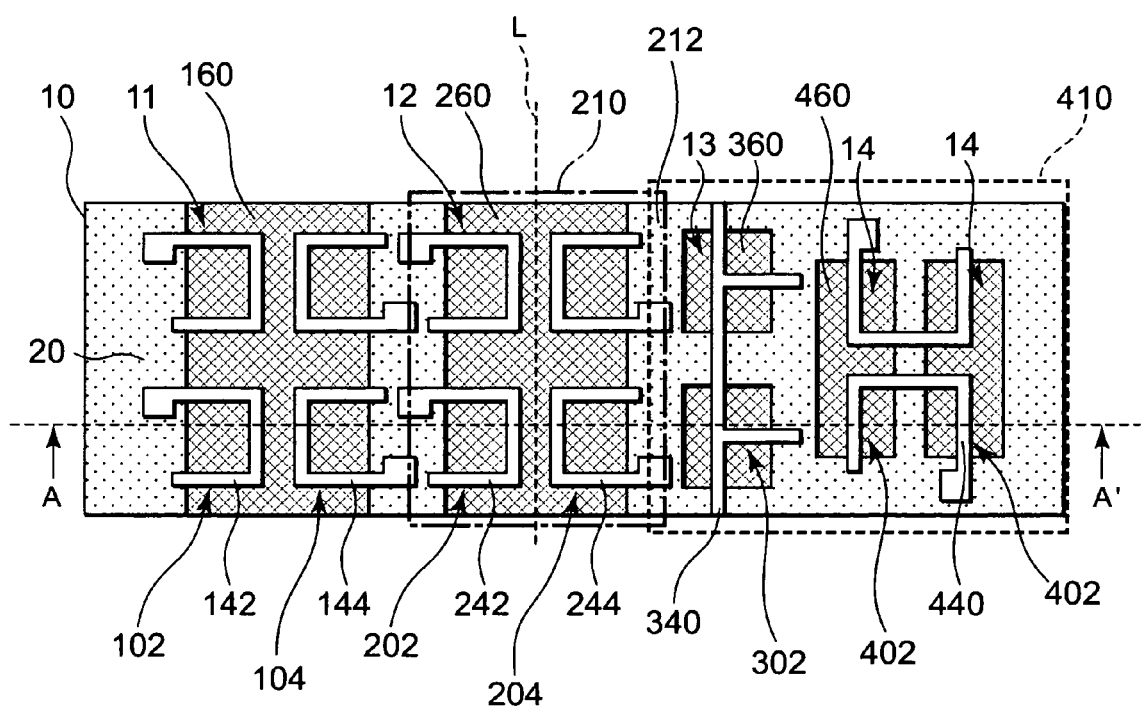
FIG. 1 is a plan view showing a structure of elements of a semiconductor device related to a first exemplary embodiment.
Figure 2:
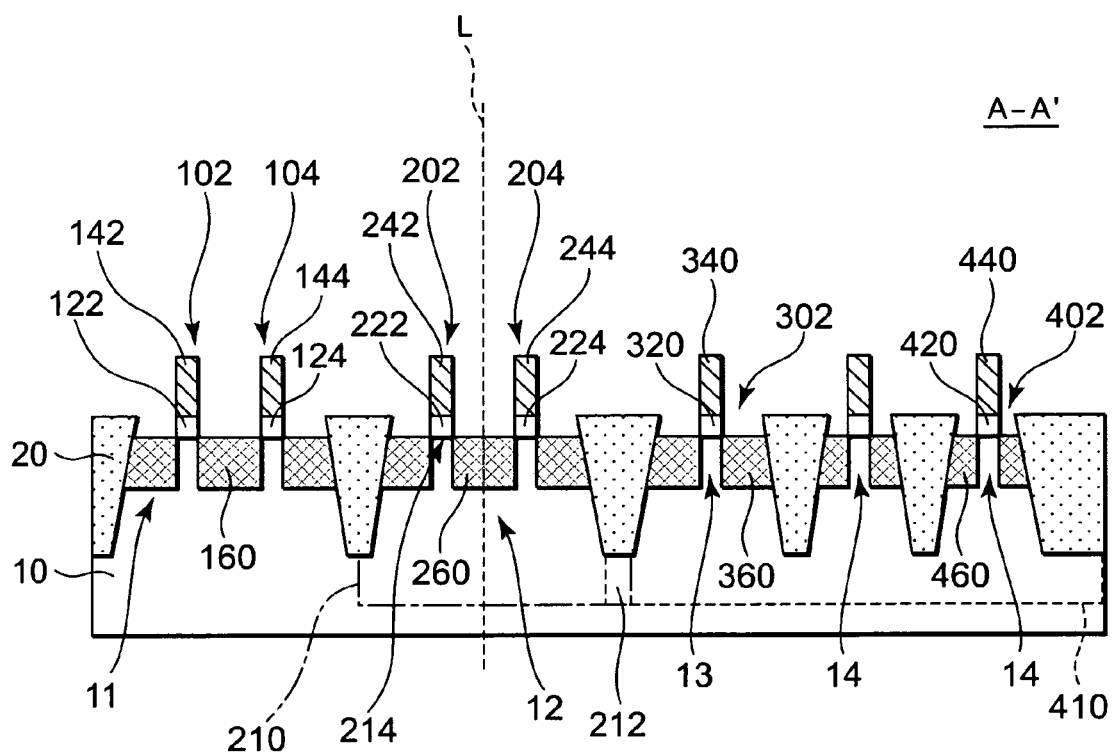
FIG. 2 is an A-A' sectional view of FIG. 1.

FIG. 1 is a plan view showing the structure of elements of a semiconductor device according to a first exemplary embodiment. FIG. 2 is an A-A' sectional view of FIG. 1. The semiconductor device has, in a first element formation region 12 of a substrate 10, a first transistor 202 of a first conductive type (for example, n type) and a second transistor 204 of the first conductive type whose threshold voltages are equal to each other. The semiconductor device has, in a second element formation region 13 of the substrate 10, a third transistor 302 of the first conductive type. The substrate 10 is, for example, a semiconductor substrate (for example, a silicon substrate). The second element formation region 13 is positioned adjacent to the first element formation region 12. No element is formed in the substrate 10 positioned between the first element formation region 12 and the second element formation region 13. The second transistor 204 is positioned between the first transistor 202 and the third transistor 302.

A channel region of the first transistor 202 (a portion where a gate electrode 242 of the first transistor 202 and the substrate 10 of the first element formation region 12 overlap) and a channel region of the second transistor 204 (a portion where a gate electrode 244 of the second transistor 204 and the substrate 10 of the first element formation region 12 overlap) have a shape which is line-symmetrical with respect to a reference line L extending between the two channel regions.

A method of manufacturing the semiconductor device has the following steps. First, the first element formation region 12 and the second element formation region 13 are each isolated from other regions by forming an element isolating film 20. Then, a first mask pattern 50 (which will be described later) is formed on the substrate 10. The first mask pattern 50 has a first opening 52 (which will be described later) and covers the second element formation region 13. The first opening 52 includes therewithin the first element formation region 12 and has a shape which is line-symmetrical with respect to the reference line L. Then, a first well 210 of a second conductive type is formed in the first element formation region 12 by introducing ions of the second conductive type into the substrate 10 by use of the first mask pattern 50 as a mask. Then the first mask pattern 50 is removed.

A second mask pattern 60 (which will be described later) is formed on the substrate 10. The second mask pattern 60 has a second opening 62 (which will be described later) and covers the first element formation region 12. The second opening 62 includes therewithin the second element formation region 13. Then, a second well 410 of the second conductive type is formed in the second element formation region 13 by introducing ions of the second conductive type into the substrate 10 by use of the second mask pattern 60 as a mask. Then, the second mask pattern 60 is removed.

The first transistor 202 and the second transistor 204 are formed in the first element formation region 12, and the third transistor 302 is formed in the second element formation region 13.

The first well 210 has a shape which is line-symmetrical with respect to the reference line L. The first well 210 and the second well 410 are linked together and the linking portion has a region 212 in which the concentration of an impurity of the second conductive type is higher than in other portions of the first well 210 and the second well 410.

Although the shortest distance from the channel region of the first transistor 202 to an end of the first well 210 and the shortest distance from the channel region of the second transistor 204 to an end of the first well 210 are both not more than 0.3 μm, the shortest distance may also be not more than 0.2 μm. The first transistor 202, the second transistor 204 and the third transistor 302 are such that the thicknesses of gate insulating films 222, 224, 320 are almost equal to each other.

In the first element formation region 12, two sets of pair transistors each composed of the first transistor 202 and the second transistor 204 are formed. The second element formation regions 13 are provided in quantities of two, and one third transistor 302 is formed in each of the second element formation regions 13.

The semiconductor device has a fourth transistor 402 of the first conductive type, a fifth transistor 102 of the second conductive type and a sixth transistor 104 of the second conductive type. The fourth transistor 402 is formed in a third element formation region 14, and the fifth transistor 102 and the sixth transistor 104 are formed in a fourth element formation region 11. The fifth transistor 102 and the sixth transistor 104 have threshold voltages which are equal to each other.

The third element formation region 14 is positioned adjacent to the second element formation region 13. The second element formation region 13 is positioned between the first element formation region 12 and the third element formation region 14. In the example shown in these drawings, the third element formation region 14 is provided in quantities of two, and two fourth transistors 402 are formed in each of the third element formation regions 14.

The fourth element formation region 11 is positioned adjacent to the first element formation region 12. The first element formation region 12 is positioned between the second element formation region 13 and the fourth element formation region 11. Two sets of pair transistors each composed of the fifth transistor 102 and the sixth transistor 104 are formed in the fourth element formation region 11.

Figure 3:
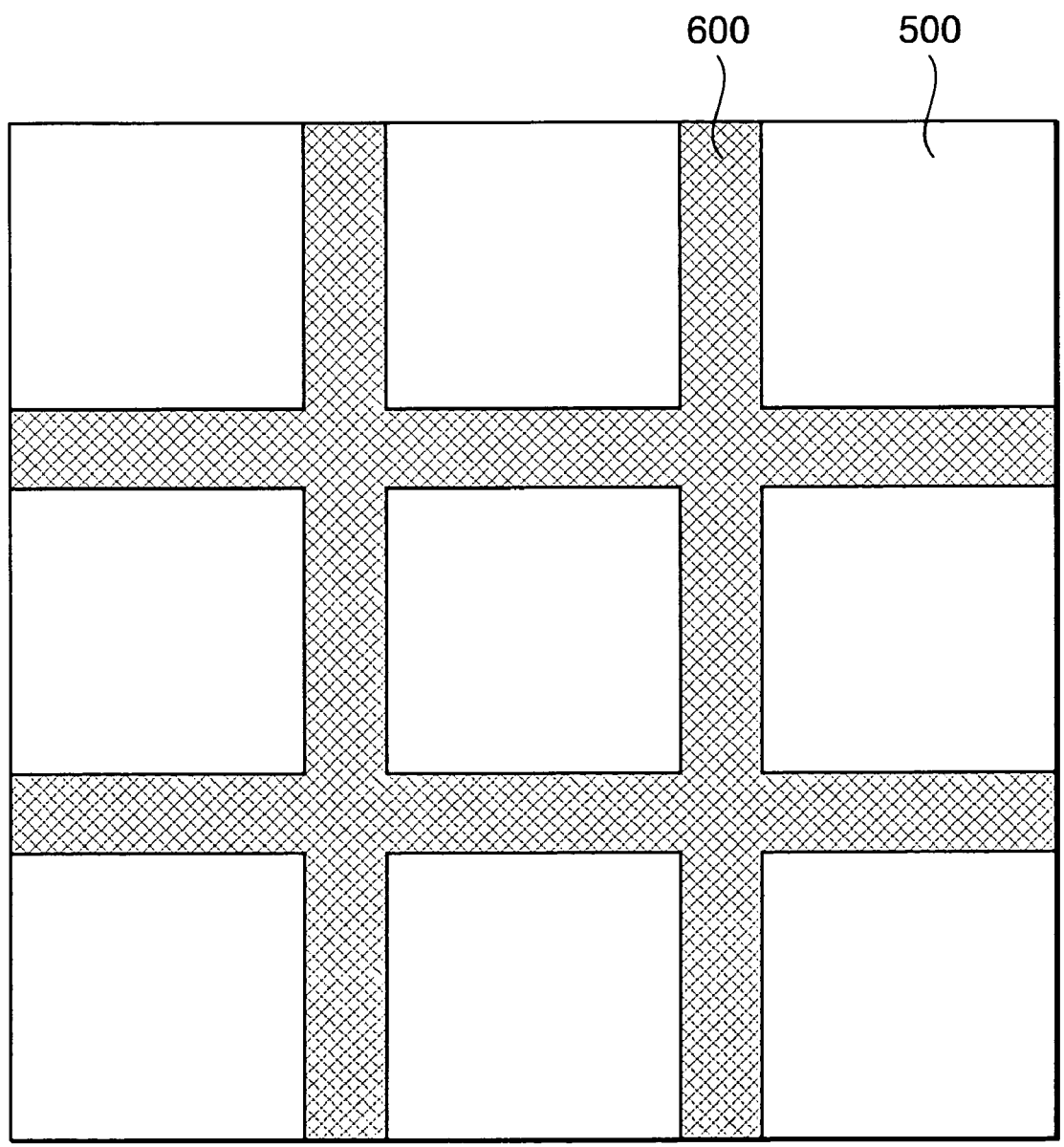
FIG. 3 is a plan view of a semiconductor device having the element structure shown in FIGS. 1 and 2.

FIG. 3 is a plan view of a semiconductor device having the element structure shown in FIGS. 1 and 2. This semiconductor device has, for example, a storage circuit and a logic circuit (not shown) which processes the information stored in this storage circuit. The storage circuit is, for example, a DRAM (dynamic random access memory), and has a plurality of memory cells 500 and a control circuit region 600. A capacitive element which stores information and the like are formed in the memory cell 500. A memory control circuit which reads and writes information in the memory cell 500 is formed in the control circuit region 600. Incidentally, it is not always necessary that the semiconductor device shown in FIG. 1 has a logic circuit.

The memory control circuit has a digit line, a sense amplifier circuit which amplifies a signal read out of the memory cell 500, an I/O (input/output) line which sends the signal read out of the memory cell 500, a selector which outputs the signal read out of the memory cell 500 to the I/O line, and an equalizer which controls the potential of the digit line. Among the transistors shown in FIGS. 1 and 2, the first transistor 202, the second transistor 204, the fifth transistor 102, and the sixth transistor 104 are part of the sense amplifier circuit, the third transistor 302 is part of the equalizer, and the fourth transistor 402 is part of the selector.

Figure 4:
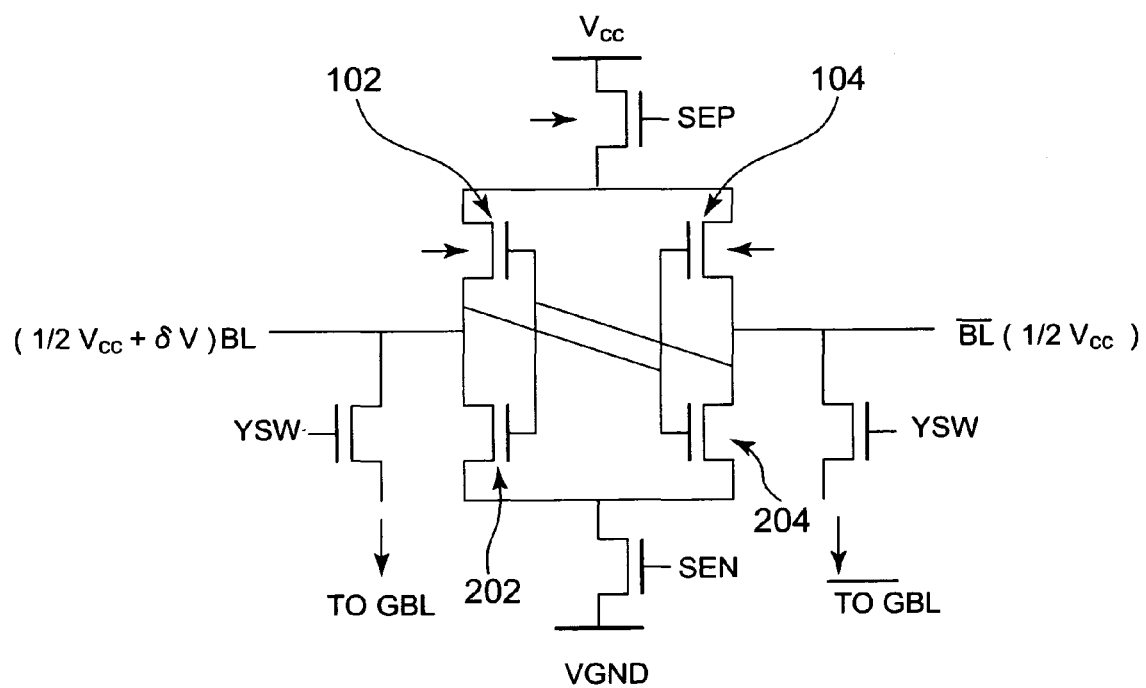
FIG. 4 is a circuit diagram of a sense amplifier circuit of a memory control circuit.

FIG. 4 is a circuit diagram of a sense amplifier circuit of a memory control circuit. The sense amplifier circuit has a flip-flop circuit. The first transistor 202 and the second transistor 204 are part of the flip-flop circuit. The fifth transistor 102 and the sixth transistor 104 are also part of the flip-flop circuit.

Next, a method of manufacturing the semiconductor device shown in FIGS. 1 and 2 will be described in detail with the aid of the plan views of FIG. 1, FIG. 2 and FIGS. 5A and 5B, and the sectional views of FIGS. 6 and 7 as well. FIGS. 6 and 7 are A-A' sectional views of FIGS. 5A and 5B.

Figure 5A:
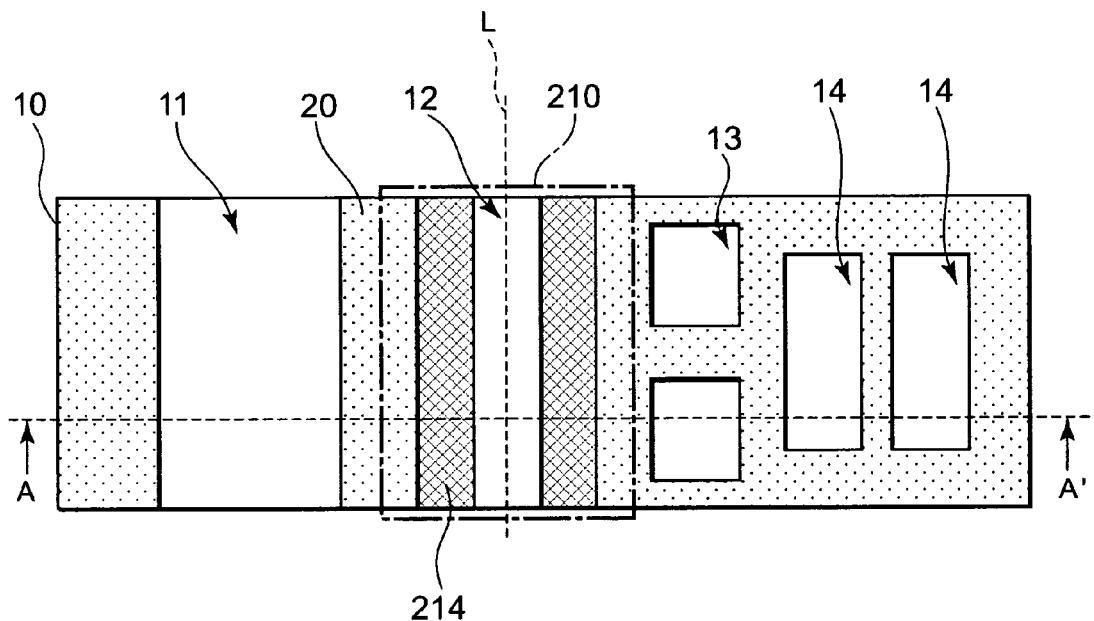
FIGS. 5A and 5B are plan views showing a manufacturing method of the semiconductor device shown in FIGS. 1 and 2.
Figure 6:
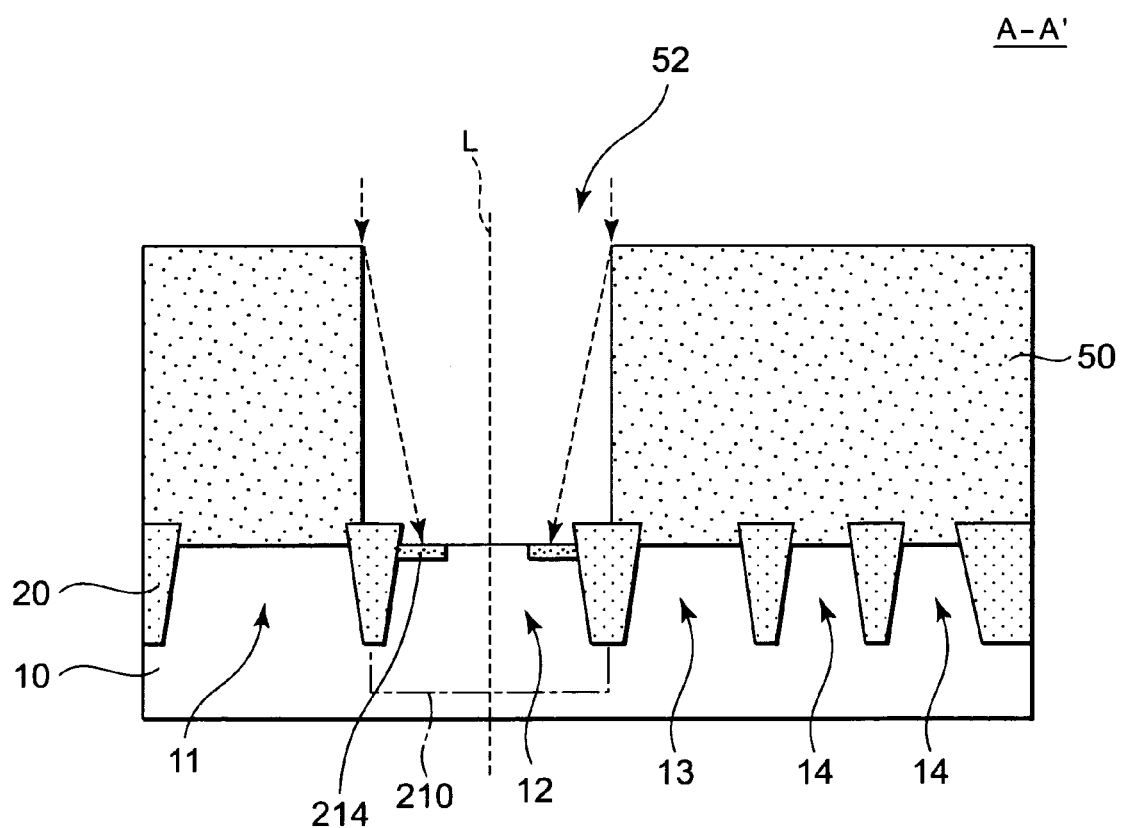
FIG. 6 is an A-A' sectional view of FIG. 5A.
Figure 7:
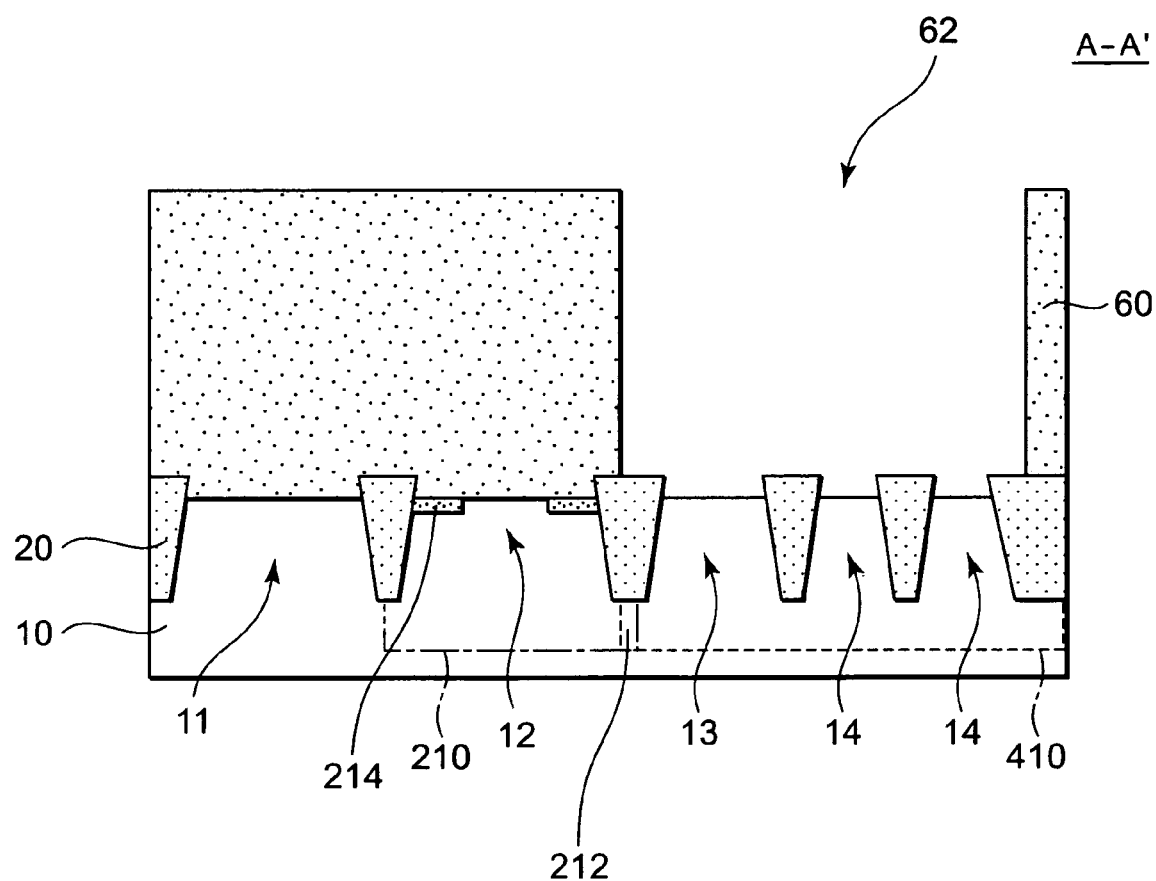
FIG. 7 is an A-A' sectional view of FIG. 5B.

As shown in FIGS. 5A and 6, an element isolating film 20 is formed on a substrate 10, and a first element formation region 12, a second element formation region 13, a third element formation region 14 and a fourth element formation region 11 are isolated from other regions. The element isolating film 20 is formed by the STI (shallow trench isolation) method, for example.

Subsequently, a first mask pattern 50 is formed on the substrate 10 and the element isolating film 20. The first mask pattern 50 has a first opening 52. The first opening 52 includes therewithin the first element formation region 12 and has a shape which is line-symmetrical with respect to the reference line L. The thickness of the first mask pattern 50 is, for example, not less than 0.6 μm but not more than 1.3 μm. Subsequently, an impurity (for example, boron) of the second conductive type is ion-implanted into the substrate 10 by use of the first mask pattern 50 as a mask. As a result, a first well 210 of the second conductive type is formed in the substrate 10 positioned in the first element formation region 12.

In the ion implantation step, part of an ion-implanted impurity collides against a side wall of a first opening 52, rebounds therefrom, and is implanted into a region of the substrate 10 positioned in the first element formation region 12, which is positioned in the vicinity of the element isolating film 20. As a result, a region of the subsurface of the first well 210 away from the element isolating film 20 at not more than a given distance becomes a high-concentration region 214 where the concentration of a second impurity is high. As described above, the first opening 52 of the first mask pattern 50 is line-symmetrical with respect to the reference line L. For this reason, also the planar shape of the high-concentration region 214 becomes line-symmetrical with respect to the reference line L.

Figure 5B:
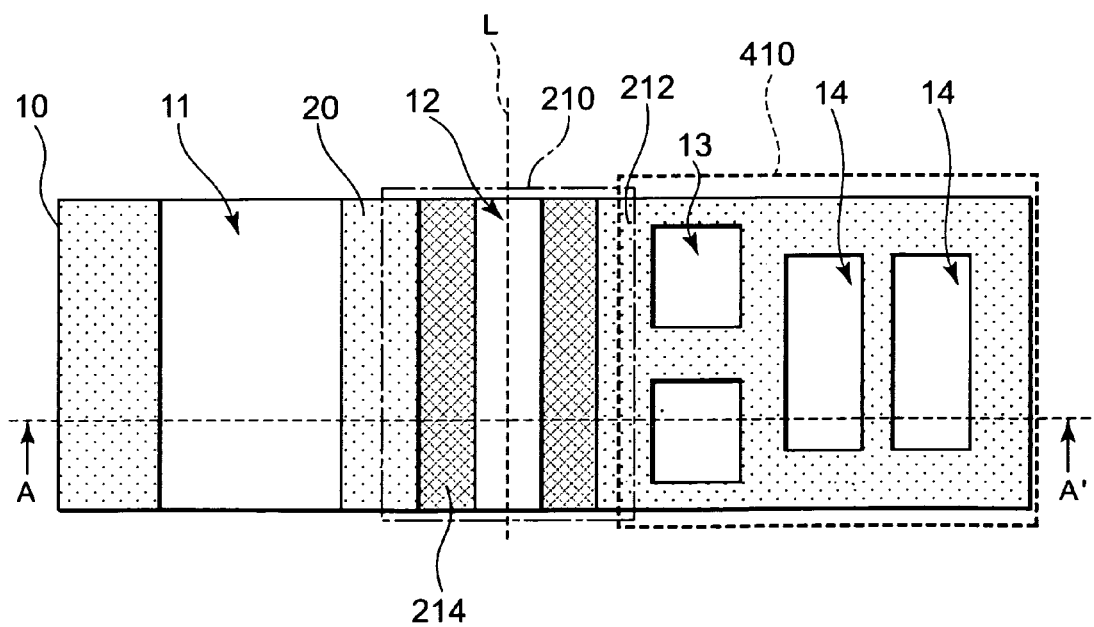

Subsequently, as shown in FIGS. 5B and 7, the first mask pattern 50 is removed. Subsequently, a second mask pattern 60 is formed on the substrate 10 and the element isolating film 20. The second mask pattern 60 has a second opening 62. The second opening 62 includes therewithin the second element formation region 13 and the third element formation region 14, and the second mask pattern 60 covers the first element formation region 12. Subsequently, an impurity (for example, boron) of the second conductive type is ion-implanted by use of the second mask pattern 60 as a mask. As a result, one second well 410 is formed in the substrate 10 positioned in the second element formation region 13 and the substrate 10 positioned in the third element formation region 14. The impurity concentration of the second well 410 is equal to the impurity concentration of the first well 210, for example.

Incidentally, the second opening 62 partly overlaps the first opening 52 of the first mask pattern 50. For this reason, the first well 210 and the second well 410 are linked together, and in the linking portion there is formed a region 212 where the impurity concentration of the second conductive type is higher than in other portions of the first well 210 and the second well 410.

After that, as shown in FIGS. 1 and 2, the second mask pattern 60 is removed. Subsequently, gate insulating films 122, 124, 222, 224, 320, 420 are formed in the same step, and furthermore gate electrodes 142, 144, 242, 244, 340, 440 are formed in the same step.

Subsequently, an upper surface of the substrate 10, an upper surface of the element isolating film 20 and each of the gate electrodes are covered with a mask film (not shown), and an opening (not shown) including therewithin a fourth element formation region 11 is formed in this mask film. Subsequently, an impurity of the first conductive type is ion-implanted by use of this mask film as a mask. As a result, an impurity region 160 which provides sources and drains of the fifth transistor 102 and the sixth transistor 104 is formed. Thereafter, the mask film is removed.

Subsequently, an upper surface of the substrate 10, an upper surface of the element isolating film 20 and each of the gate electrodes are covered with a mask film (not shown), and an opening (not shown) including therewithin the first element formation region 12, the second element formation region 13 and the third element formation region 14 are formed in this mask film. Subsequently, an impurity of the first conductive type is ion-implanted by use of this mask film as a mask. As a result, impurity regions 260, 360, 460 which provide sources and drains of the first to fourth transistors 202, 204, 302, 402 are formed. After that, the mask film is removed.

Next, the operation and effect of the exemplary embodiment will be described. As described above, in the ion implantation step adopted in the formation of the first well 210, part of an ion-implanted impurity collides against a side wall of the first opening 52 and rebounds therefrom, and therefore a high-concentration region 214 where the concentration of a second impurity is high is formed on the subsurface of the first well 210. When the high-concentration region 214 and a channel region of a transistor overlap, the threshold voltage of the transistor changes.

Figure 8:
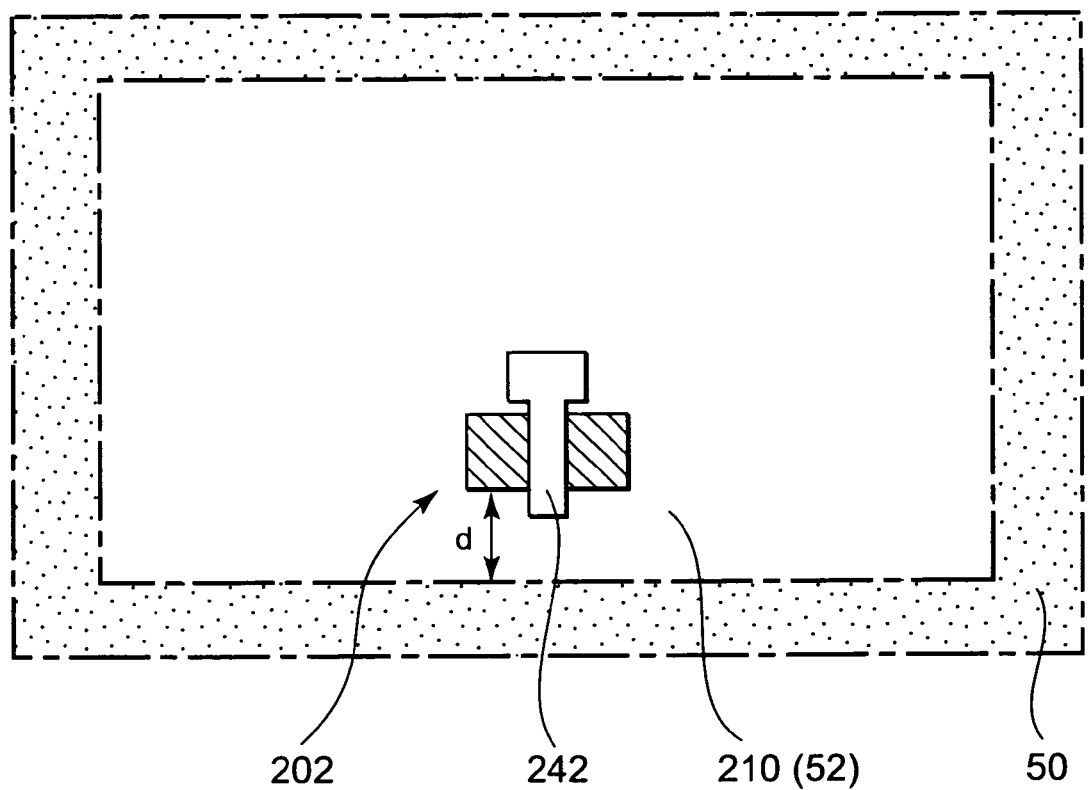
FIG. 8 is a diagram showing a simplified shape of a first transistor.
Figure 9:
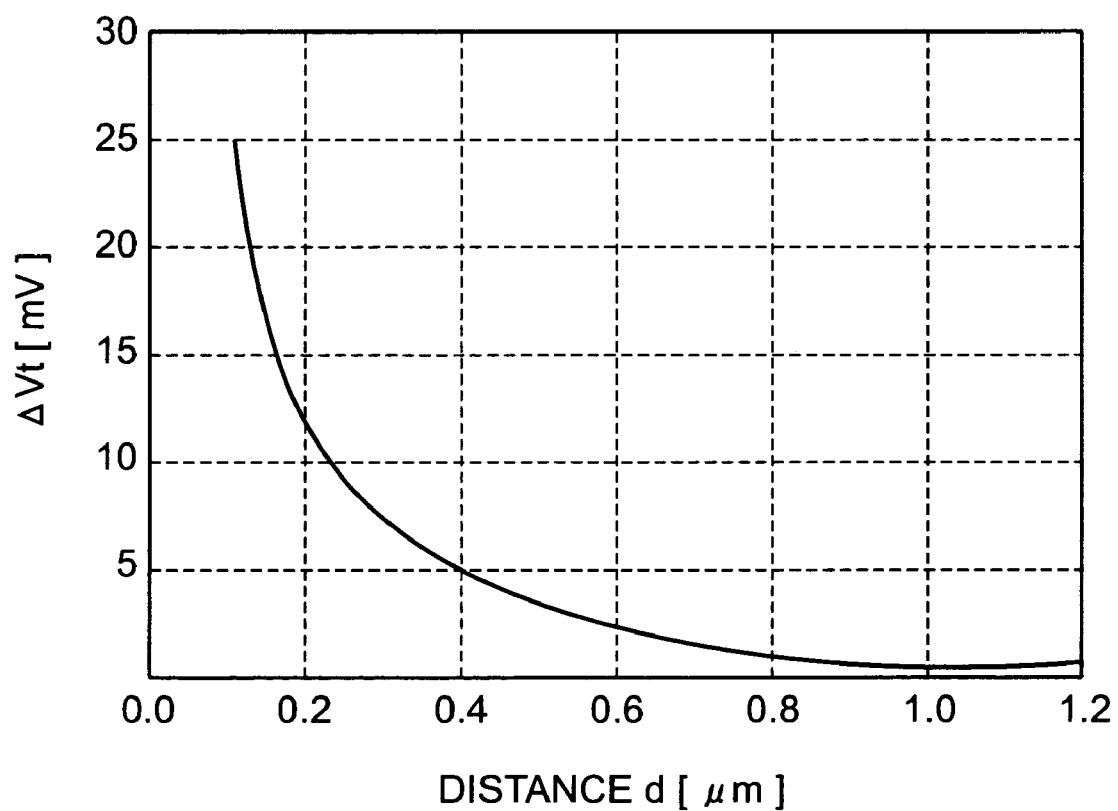
FIG. 9 is a graph showing the correlation between the shortest distance d shown in FIG. 8 and the threshold voltage of a transistor.

As shown in FIG. 8, the shape of the first transistor 202 is simplified. FIG. 9 is a graph showing the correlation between the shortest distance d from an end of the first opening 52 of the first mask pattern, i.e., from an end of the first well 210 to the gate electrode 242 (channel region) of the first transistor 202 and the threshold voltage of the first transistor 202 in a case where the first transistor 202 has the shape shown in FIG. 8. When the shortest distance d is over 0.9 μm, the threshold voltage of the first transistor 202 is constant. However, when the shortest distance d is not more than 0.9 μm, the threshold voltage of the first transistor 202 changes abruptly as the shortest distance d becomes shorter. This is because the high-concentration region 214 and the channel region of the first transistor 202 overlap and because the amount of this overlap increases with decreasing shortest distance d. This effect becomes remarkable when the shortest distance d is not more than 0.3 μm and becomes particularly remarkable when the shortest distance d is not more than 0.2 μm.

In the exemplary embodiment, as described above, the first opening 52 of the first mask pattern 50 is line-symmetrical with respect to the reference line L. For this reason, also the planar shape of the high-concentration region 214 becomes line-symmetrical with respect to the reference line L. The channel region of the first transistor 202 and the second transistor 204 are line-symmetrical with respect to the reference line L. Therefore, even when as shown in FIG. 2 part of the high-concentration region 214 overlaps each of the channel region of the first transistor 202 and the channel region of the second transistor 204, the amount of an overlap becomes the same. Therefore, it is possible to prevent the threshold voltage of the first transistor 202 and the threshold voltage of the second transistor 204 from obtaining different values.

For the sake of comparison with the exemplary embodiment, forming the first well 210 and the second well 410 in the same step is thought of. Because the width of the element isolating film 20 positioned between the first element formation region 12 and the second element formation region 13 is narrow (for example, not more than 0.2 μm), it is impossible to form openings corresponding to each of the first well 210 and the second well 410 on one mask pattern. For this reason, when the first well 210 and the second well 410 are formed in the same step, these two wells are formed by one opening and hence the opening is not line-symmetrical with respect to the reference line L. Therefore, the high-concentration region 214 of the first well 210 does not become line-symmetrical with respect to the reference line L, and only either of the channel region of the first transistor 202 and the channel region of the second transistor 204 overlaps the high-concentration region 214. In this case, the threshold voltage of the first transistor 202 and the threshold voltage of the second transistor 204 obtain values different from each other.

Therefore, according to the exemplary embodiment, in the first transistor 202 and second transistor 204 whose threshold voltages are required to be equal, it is possible to prevent the threshold voltages from obtaining different values. For this reason, when the first transistor 202 and the second transistor 204 form a flip-flop circuit and a sense amplifier circuit, it is possible to prevent the characteristics of the flip-flop circuit and the sense amplifier circuit from deteriorating. The effect becomes remarkable when the shortest distance from the channel region of the first transistor 202 to the first opening 52 is not more than 0.3 μm.

The first opening 52 of the first mask pattern 50 and the second opening 62 of the second mask pattern 60 partly overlap each other. For this reason, even when the width of the element isolating film 20 positioned between the first element formation region 12 and the second element formation region 13 is narrow, it is possible to make the first opening 52 large for the first element formation region 12 and to make the second opening 62 large for the second element formation region 13. Therefore, even when mask misalignment occurs, it is possible to form the first well 210 and the second well 410.

Incidentally, although in the exemplary embodiment an extension region (LDD (lightly doped drain) region) of an impurity region, which provides sources and drains, and a side wall are not illustrated, each of the above-described transistors may have these.

In the exemplary embodiment, the third element formation region 14 and the fourth transistor 402 as well as the fourth element formation region 11, the fifth transistor 102 and the sixth transistor 104 were each formed. However, the above-described effect can be obtained even when these are not formed. In the exemplary embodiment, it is possible to make the threshold voltages of the first transistor 202, the second transistor 204, the third transistor 302 and the fourth transistor 402 equal to each other, and it is also possible to make the threshold voltages of the third transistor 302 and the fourth transistor 402 different from the threshold voltages of the first transistor 202 and the second transistor 204.

Second Exemplary Embodiment

Figure 10:
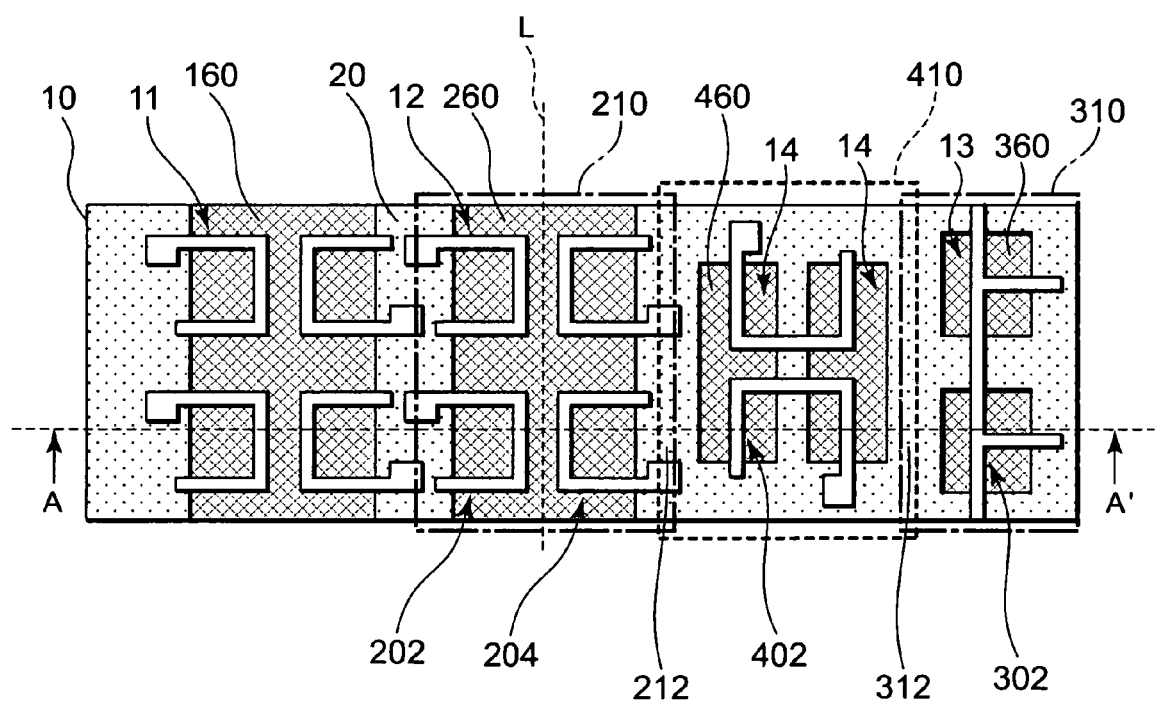
FIG. 10 is a plan view of a semiconductor device related to a second exemplary embodiment.
Figure 11:
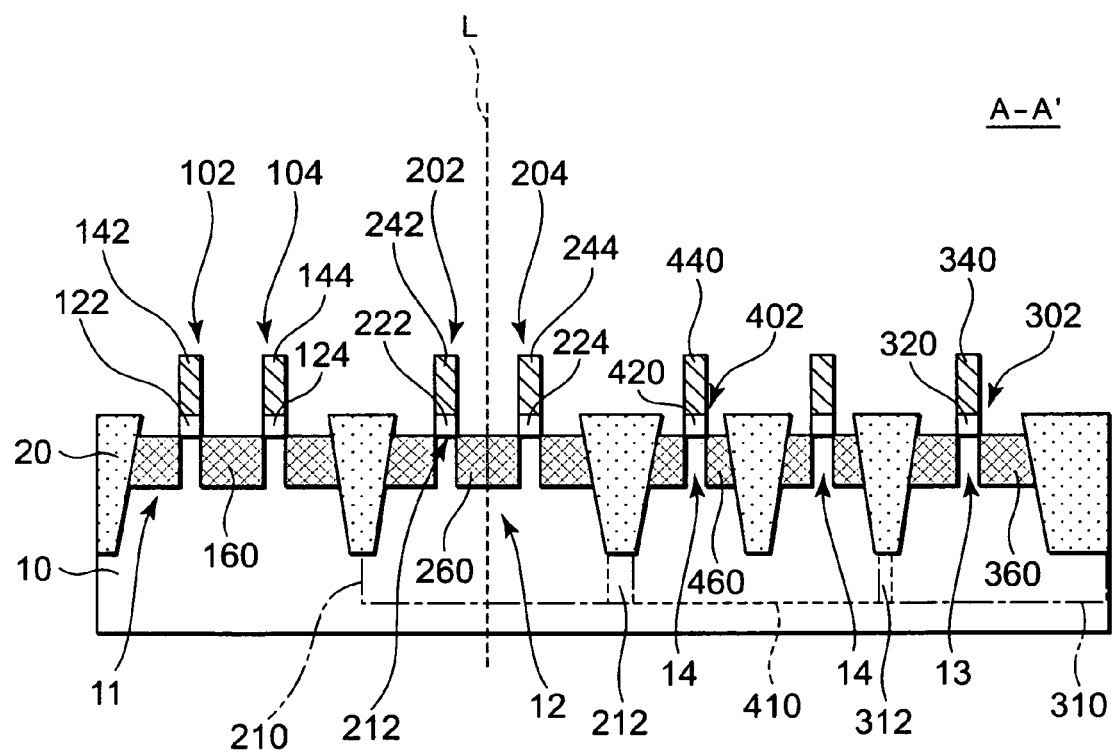
FIG. 11 is an A-A' sectional view of FIG. 10.

FIG. 10 is a plan view of a semiconductor device according to a second exemplary embodiment, and FIG. 11 is an A-A' sectional view of FIG. 10. The semiconductor device has the same configuration as the semiconductor device according to the first exemplary embodiment with the exception of the following points.

First, the positions of a second element formation region 13 and a third transistor 302 and of a third element formation region 14 and a fourth transistor 402 are reverse to each other. That is, in the exemplary embodiment, the third element formation region 14 is positioned between a first element formation region 12 and the second element formation region 13. A second well 410 is formed in the third element formation region 14 alone, and a third well 310 of the second conductive type is formed in the second element formation region 13. The second well 410 and the third well 310 are linked together, and this linking portion has a region 312 where the impurity concentration of the second conductive type is high.

Next, a method of manufacturing the semiconductor device related to the exemplary embodiment will be described with the aid of FIGS. 12A and 12B, FIG. 13 and FIG. 14. FIG. 13 is an A-A' sectional view of FIG. 12A, and FIG. 14 is an A-A' sectional view of FIG. 12B.

Figure 12A:
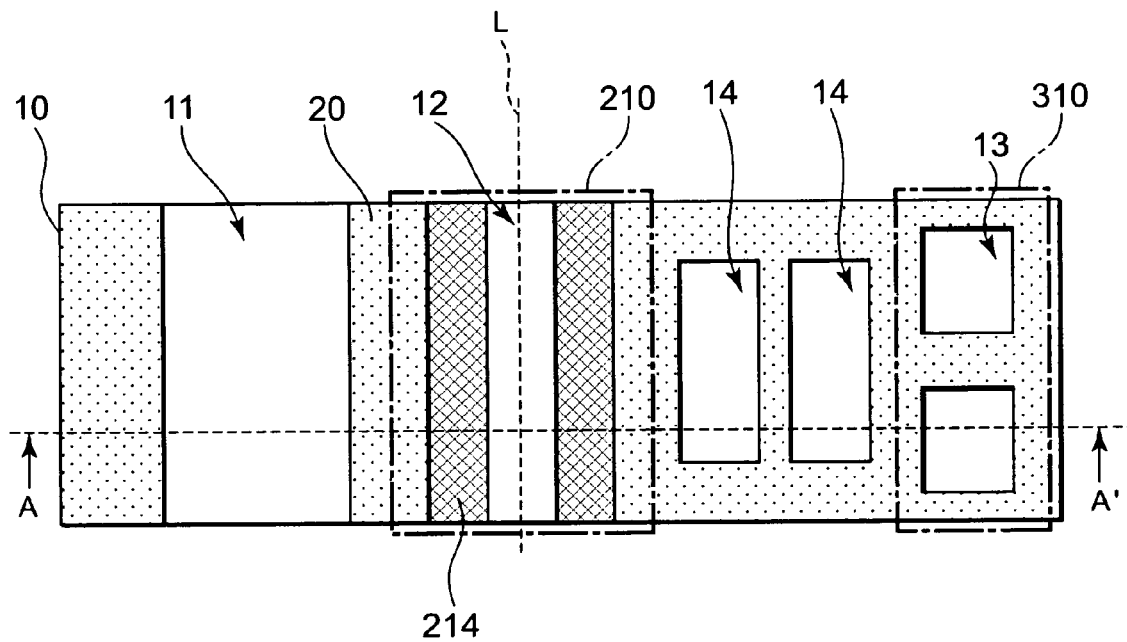
FIGS. 12A and 12B are plan views showing a manufacturing method of the semiconductor device shown in FIGS. 10 and 11.
Figure 13:
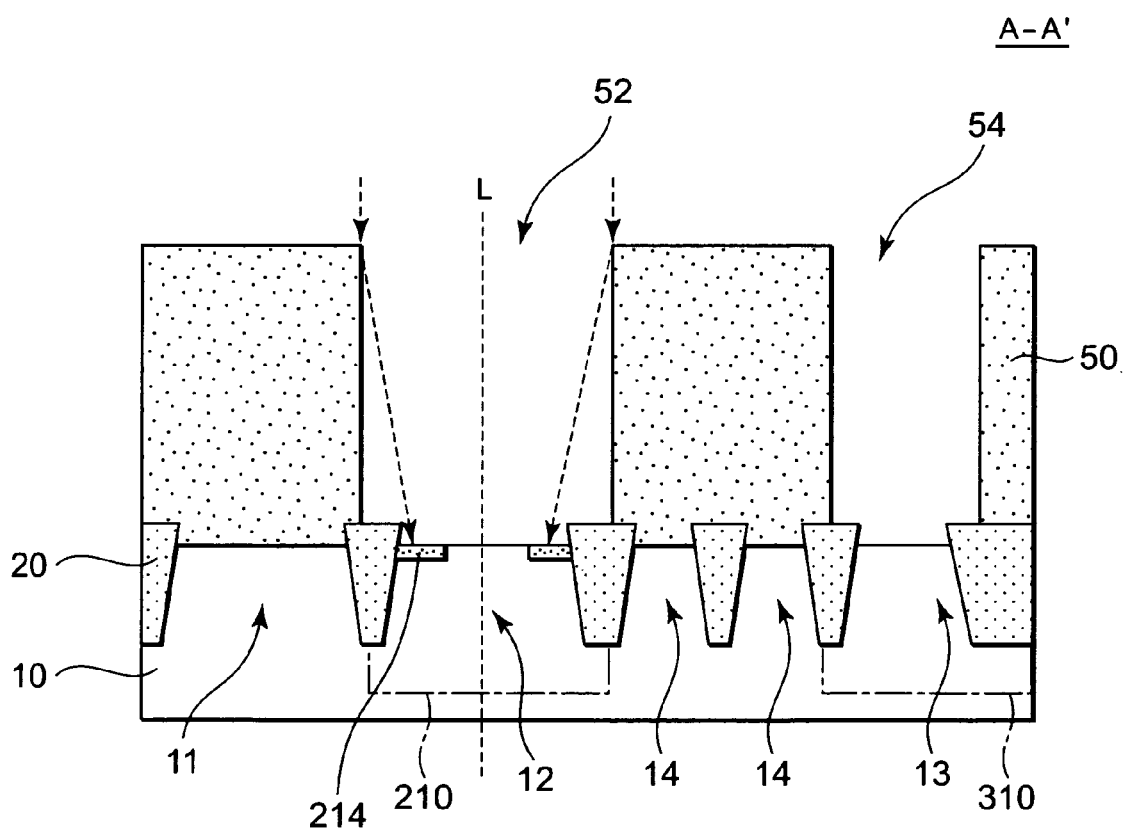
FIG. 13 is an A-A' sectional view of FIG. 12A.

First, as shown in FIG. 12A and FIG. 13, an element isolating film 20 is formed on a substrate 10. Subsequently, a first mask pattern 50 is formed. In the exemplary embodiment, the first mask pattern 50 has a third opening 54 including therewithin a second element formation region 13 in addition to a first opening 52 including therewithin a first element formation region 12. Subsequently, an impurity (for example, boron) of the second conductive type is ion-implanted into the substrate 10 with first energy by use of the first mask pattern 50 as a mask. As a result, a first well 210 of the second conductive type is formed in the substrate 10 positioned in the first element formation region 12, and a third well 310 of the second conductive type is formed in the substrate 10 positioned in the second element formation region 13. At this time, a high-concentration region 214 is formed in the first element formation region 12. Incidentally, although a region similar to the high-concentration region 214 is formed also in the second element formation region 13, the illustration thereof is omitted.

Subsequently, an impurity (for example, boron) of the second conductive type is ion-implanted into the substrate 10 with a second energy lower than the first energy by use of the first mask pattern 50 as a mask. As a result, threshold voltages of a first transistor 202, a second transistor 204 and a third transistor 302 are adjusted to almost the same value.

Figure 12B:
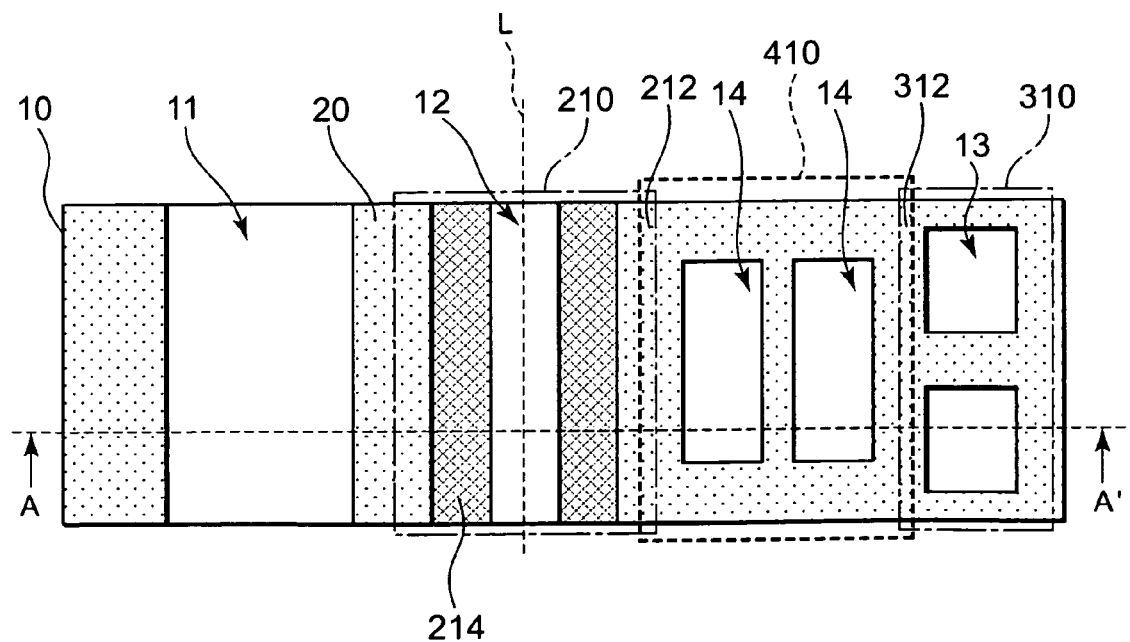
Figure 14:
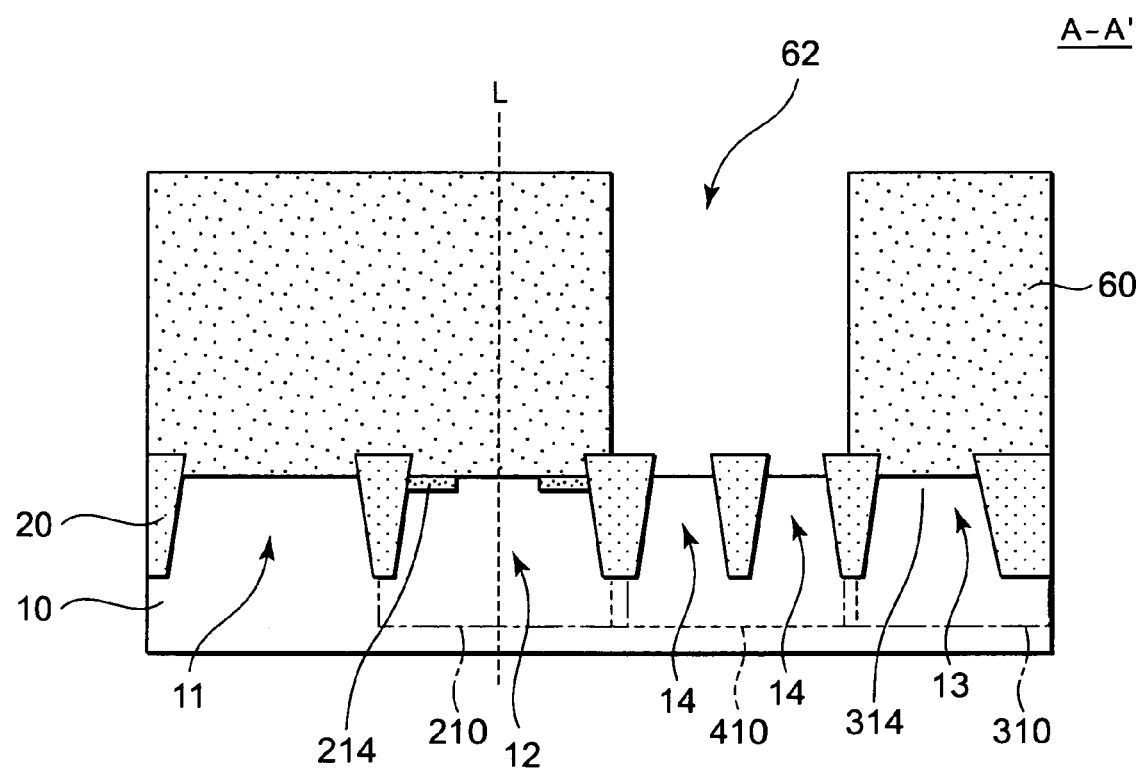
FIG. 14 is an A-A' sectional view of FIG. 12B.
Figure 15:
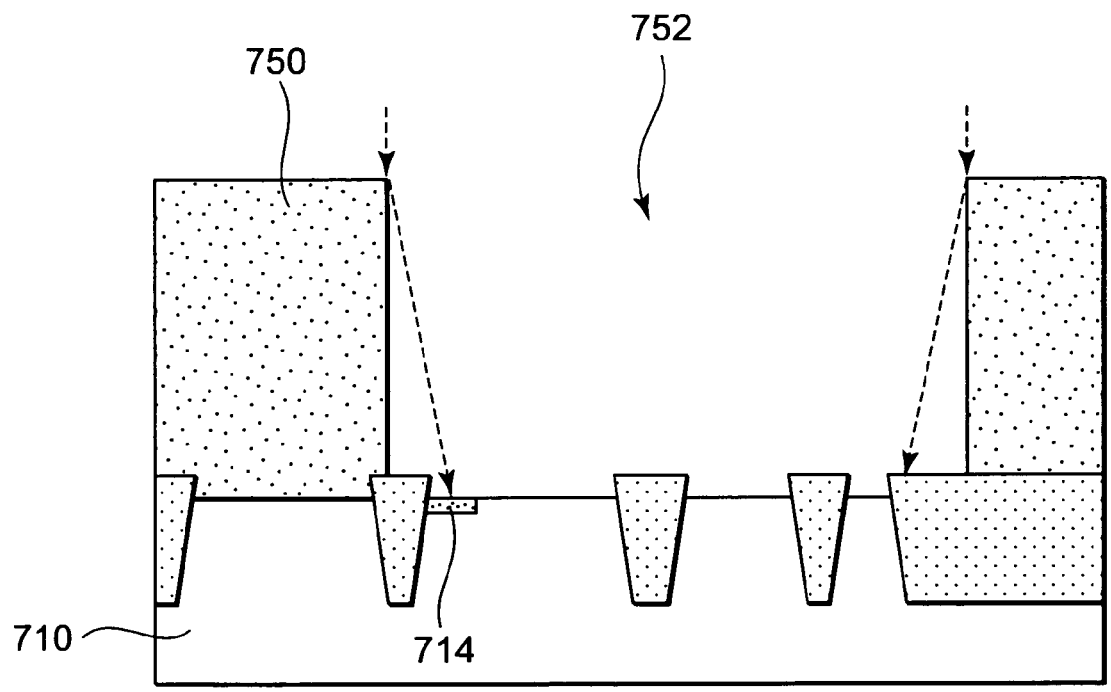
FIG. 15 is a diagram to explain a problem of a related art.

After that, as shown in FIGS. 12B and 14, the first mask pattern 50 is removed. Subsequently, a second mask pattern 60 is formed. In the exemplary embodiment, a second opening 62 of the second mask pattern 60 includes therewithin the third element formation region 14 but does not include therewithin the second element formation region 13. Subsequently, an impurity (for example, boron) of the second conductive type is ion-implanted by use of the second mask pattern 60 as a mask. As a result, the second well 410 is formed in the substrate 10 positioned in the third element formation region 14.

The processing thereafter is the same as in the first exemplary embodiment and hence the description thereof is omitted.

The second exemplary embodiment can obtain the same effect as in the first exemplary embodiment. Because the adjustment step of the threshold voltage of the third transistor 302 can be included in the adjustment step of the threshold voltages of the first transistor 202 and the second transistor 204, it is possible to reduce the manufacturing cost of the semiconductor device. Incidentally, it is also possible to cause the threshold voltage of the fourth transistor 402 to obtain the same value as the first transistor 202, the second transistor 204 and the third transistor 302 in the second exemplary embodiment, and it is also possible to cause the threshold voltage of the fourth transistor 402 to obtain a different value.

Hereinabove, the exemplary embodiments of the present invention are described with reference to the drawings. However, these are illustrative of the present invention and it is also possible to adopt various constitutions other than those described above.

Further, it is noted that Applicant's intent is to encompass equivalents of all claim elements, even if amended later during prosecution.

What is claimed is:

1. A method of manufacturing a semiconductor device, the semiconductor device comprising:
   a first transistor of a first conductive type and a second transistor of the first conductive type whose threshold voltages are equal to each other, in a first element formation region; and
   a third transistor of the first conductive type, in a second element formation region positioned adjacent to the first element formation region,
   wherein the second transistor is positioned between the first transistor and the third transistor, and a channel region of the first transistor and a channel region of the second transistor have a shape which is line-symmetrical with respect to a reference line extending between the channel regions of the first and second transistors,
   the method comprising:
      isolating the first element formation region and the second element formation region from each other by forming an element isolating film on a substrate;
      forming, on the substrate, a first mask pattern which has a first opening exposing the first element formation region and having a shape which is line-symmetrical with respect to the reference line, and covers the second element formation region;
      forming a first well of a second conductive type in the first element formation region by ion-implanting an impurity of the second conductive type into the substrate by using the first mask pattern as a mask;
      removing the first mask pattern;
      forming, on the substrate, a second mask pattern which has a second opening exposing the second element formation region and covers the first element formation region;
      forming a second well of the second conductive type in the second element formation region by ion-implanting an impurity of the second conductive type into the substrate by using the second mask pattern as a mask;
      removing the second mask pattern; and
      forming the first transistor and the second transistor in the first element formation region, and the third transistor in the second element formation region.

2. The method according to claim 1, wherein no element is formed on the substrate between the first element formation region and the second element formation region.

3. The method according to claim 1, wherein the first transistor, the second transistor and the third transistor are such that a thickness of a gate insulating film thereof is almost the same.

4. The method according to claim 1, wherein the first transistor and the second transistor are a part of a flip-flop circuit.

5. The method according to claim 1:
   wherein the semiconductor device further includes a memory cell, a digit line, a sense amplifier circuit which amplifies a signal read out of the memory cell, an input and output line which sends the signal, a selector which outputs the signal to the input and output line, and an equalizer which controls a potential of the digit line;
   wherein the first transistor and the second transistor are a part of the sense amplifier circuit; and
   wherein the third transistor is a part of the selector or the equalizer.

6. The method according to claim 1:
   wherein the semiconductor device further includes a fourth transistor of the first conductive type, whose threshold voltage is almost equal to the threshold voltages of the first transistor and the second transistor, in a third element formation region; and
   wherein the second element formation region is positioned between the first element formation region and the third element formation region,
   the method further comprising:
      forming, in the forming the first mask pattern, a third opening exposing the third element formation region in the first mask pattern;
      forming, in the forming the first well, a third well in the third element formation region; and
      adjusting threshold voltages of the first transistor, the second transistor and the fourth transistor, between the forming the first mask pattern and the removing the first mask pattern, by introducing an impurity of the second conductive type into the substrate by using the first mask pattern as a mask.

7. The method according to claim 1, wherein the first opening and the second opening overlap partly as plane viewed.

8. The method according to claim 1, wherein a shortest distance from the channel region of the first transistor to the first opening and a shortest distance from the channel region of the second transistor to the first opening are substantially equal and are not more than 0.3 μm.

9. A method of forming a semiconductor device, comprising:
   forming a first element isolation region, a second element isolation region and a third element isolation region in that order on a semiconductor substrate so that the first element isolation region is separated from the second element isolation region by a first distance, and the second element isolation region is separated from the third element isolation region by a second distance different from the first distance, in order to provide a first element formation region intervened between the first and second element isolation regions, and a second element formation region intervened between the second and third element isolation regions;

forming a first mask layer which exposes the first element formation region and covers the second element formation region;

introducing an impurity into the first element formation region by using the first mask layer as a mask to form a first well region defined by the first and second element isolation regions;

removing the first mask layer;

forming a second mask layer which covers the first element formation region and exposes the second element formation region;

introducing the impurity into the second element formation region by using the second mask layer as a mask to form a second well region defined by the second and third element isolation regions so that the second well region is in contact with the first well region;

removing the second mask layer; and forming a first gate electrode and a second gate electrode on the first well region so that the first and second gate electrodes are symmetrically arranged with respect to a line located at a center portion of the first well region.

* * * * *